United States Patent
Chen

(10) Patent No.: US 12,004,399 B2
(45) Date of Patent: Jun. 4, 2024

(54) ORGANIC LIGHT-EMITTING DIODE DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Jun Chen, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 1000 days.

(21) Appl. No.: 16/961,119

(22) PCT Filed: Apr. 9, 2020

(86) PCT No.: PCT/CN2020/084026
§ 371 (c)(1),
(2) Date: Jul. 9, 2020

(87) PCT Pub. No.: WO2021/184459
PCT Pub. Date: Sep. 23, 2021

(65) Prior Publication Data
US 2023/0165093 A1    May 25, 2023

(30) Foreign Application Priority Data
Mar. 19, 2020  (CN) .......... 202010194976.2

(51) Int. Cl.
*H10K 59/32* (2023.01)
*H10K 59/80* (2023.01)

(52) U.S. Cl.
CPC .......... *H10K 59/32* (2023.02); *H10K 59/873* (2023.02); *H10K 59/8051* (2023.02); *H10K 59/8052* (2023.02)

(58) Field of Classification Search
CPC .. H10K 59/32; H10K 59/873; H10K 59/8051; H10K 59/8052; H10K 59/95; H10K 59/10
See application file for complete search history.

(56) References Cited

U.S. PATENT DOCUMENTS

2006/0006792 A1   1/2006  Strip
2014/0145161 A1   5/2014  Naijo
(Continued)

FOREIGN PATENT DOCUMENTS

CN   101601137 A   12/2009
CN   102169266 A   8/2011
(Continued)

*Primary Examiner* — Syed I Gheyas
(74) *Attorney, Agent, or Firm* — Amster, Rothstein & Ebenstein LLP

(57) ABSTRACT

An organic light-emitting diode display panel is disclosed. By using four display panels sequentially disposed in a stack arrangement from top to bottom, light emitted in a same direction from each of the display panels, and subpixels of the four display panels not overlapping one another, a screen resolution of the organic light-emitting diode display panel can increase by three times without increasing pixel density of masks or density of array layers.

16 Claims, 2 Drawing Sheets

(56) References Cited

U.S. PATENT DOCUMENTS

2015/0090986 A1    4/2015   Toyoda et al.
2016/0211484 A1    7/2016   Naijo
2019/0348477 A1*   11/2019   Chien .................... H10K 71/00

FOREIGN PATENT DOCUMENTS

| CN | 108666351 A | 10/2018 |
| CN | 109065572 A | 12/2018 |
| CN | 109148545 A | 1/2019 |
| CN | 109273518 A | 1/2019 |
| CN | 109449184 A | 3/2019 |
| CN | 109637387 A | 4/2019 |
| KR | 20150079324 A | 7/2015 |

* cited by examiner

ORGANIC LIGHT-EMITTING DIODE DISPLAY PANEL

BACKGROUND OF INVENTION

1. Field of Invention

The present invention relates to a technical field of displays, and particularly to, an organic light-emitting diode display panel.

2. Related Art

In recent years, organic light-emitting diode (OLED) display technologies have developed in leaps and bounds. OLED products have attracted more and more attention and are used in wider ranges due to advantages of being compact and light weight, quick response times, high contrast, and bendability, and are mainly used in display fields, such as mobile phones, tablets, and televisions.

At present, mainstream OLED screens are 2K resolution screens. Display screens are always developing to reach higher and higher resolution. Array layers used in OLED screens are very complicated, wherein manufacturing of RGB evaporation type OLED screens further need to use fine masks, resulting in high difficulty in increasing pixel density and cost of doing so is also high.

Therefore, it is imperative to provide an improved display panel with a higher pixel density.

SUMMARY OF INVENTION

The present application is to provide an organic light-emitting diode display panel to overcome the problem in the prior art.

An embodiment of the present application provides an organic light-emitting diode display panel capable of efficiently overcoming the problem of a higher cost resulting from increasing pixel density and the use of fine metal masks.

In a first aspect of the present application, an embodiment of the present application provides an organic light-emitting diode (OLED) display panel, comprising a first display panel, a second display panel, a third display panel, and a fourth display panel all sequentially disposed in a stack arrangement from top to bottom, wherein an optical adhesive layer is disposed between the second display panel and the third display panel; wherein each of the first display panel, the second display panel, the third display panel, and the fourth display panel comprises a plurality of subpixels spaced apart from each other, and the plurality of subpixels comprise a plurality of first subpixels, a plurality of second subpixels, and a plurality of third subpixels all spaced apart from each other in sequence; wherein each of the first display panel, the second display panel, the third display panel, and the fourth display panel is provided with a light-emitting direction the same as each other, and each of the first display panel, the second display panel, the third display panel, and the fourth display panel has light transmittance.

Further, orthographic projections of the subpixels projected on a horizontal surface are not overlapping one another.

Further, the fourth display panel comprise a fourth thin-film encapsulation layer; a reflective cathode layer disposed on the fourth thin-film encapsulation layer; a fourth OLED layer disposed on the reflective cathode layer; a fourth array layer disposed on the fourth OLED layer; and a second light-transmissive substrate disposed on the fourth array layer.

Further, the third display panel comprises a third array layer disposed on the second light-transmissive substrate; a third OLED layer disposed on the third array layer; a third translucent cathode layer disposed on the third OLED layer; and a third thin-film encapsulation layer disposed on the third translucent cathode layer.

Further, each of the fourth array layer and the third array layer is provided with a transparent anode layer.

Further, the second display panel comprises a second thin-film encapsulation layer; a second translucent cathode layer disposed on the second thin-film encapsulation layer; a second OLED layer disposed on the second translucent cathode layer; a second array layer disposed on the second OLED layer; and a first light-transmissive substrate disposed on the second array layer.

Further, the first display panel comprises a first array layer disposed on the first light-transmissive substrate; a first OLED layer disposed on the first array layer; a first translucent cathode layer disposed on the first OLED layer; and a first thin-film encapsulation layer disposed on the first translucent cathode layer.

Further, each of the second array layer and the first array layer is provided with a transparent anode layer.

In a second aspect of the present application, an embodiment of the present application provides an organic light-emitting diode (OLED) display panel, comprising a first display panel, a second display panel, a third display panel, and a fourth display panel all sequentially disposed in a stack arrangement from top to bottom; wherein each of the first display panel, the second display panel, the third display panel, and the fourth display panel comprises a plurality of subpixels spaced apart from each other; wherein each of the first display panel, the second display panel, the third display panel, and the fourth display panel is provided with a light-emitting direction the same as each other, and each of the first display panel, the second display panel, the third display panel, and the fourth display panel has light transmittance.

Further, orthographic projections of the subpixels projected on a horizontal surface are not overlapping one another.

Further, the fourth display panel comprise a fourth thin-film encapsulation layer; a reflective cathode layer disposed on the fourth thin-film encapsulation layer; a fourth OLED layer disposed on the reflective cathode layer; a fourth array layer disposed on the fourth OLED layer; and a second light-transmissive substrate disposed on the fourth array layer.

Further, the third display panel comprises a third array layer disposed on the second light-transmissive substrate; a third OLED layer disposed on the third array layer; a third translucent cathode layer disposed on the third OLED layer; and a third thin-film encapsulation layer disposed on the third translucent cathode layer.

Further, each of the fourth array layer and the third array layer is provided with a transparent anode layer.

Further, the second display panel comprises a second thin-film encapsulation layer; a second translucent cathode layer disposed on the second thin-film encapsulation layer; a second OLED layer disposed on the second translucent cathode layer; a second array layer disposed on the second OLED layer; and a first light-transmissive substrate disposed on the second array layer.

Further, the first display panel comprises a first array layer disposed on the first light-transmissive substrate; a first OLED layer disposed on the first array layer; a first translucent cathode layer disposed on the first OLED layer; and a first thin-film encapsulation layer disposed on the first translucent cathode layer.

Further, each of the second array layer and the first array layer is provided with a transparent anode layer.

Further, the plurality of subpixels comprise a plurality of first subpixels, a plurality of second subpixels, and a plurality of third subpixels all spaced apart from each other in sequence.

Further, an optical adhesive layer is disposed between the second display panel and the third display panel.

Compared to the prior art, the present application has advantages as follows: by using four display panels sequentially disposed in a stack arrangement from top to bottom, light emitted in a same direction from each of the display panels, and the subpixels of the four display panels not overlapping one another, a screen resolution of the OLED display panel can increase by three times without increasing pixel density of masks (or not using a fine metal mask, or FMM for short) or density of array layers.

DESCRIPTION OF PREFERRED EMBODIMENTS

Figure 1:
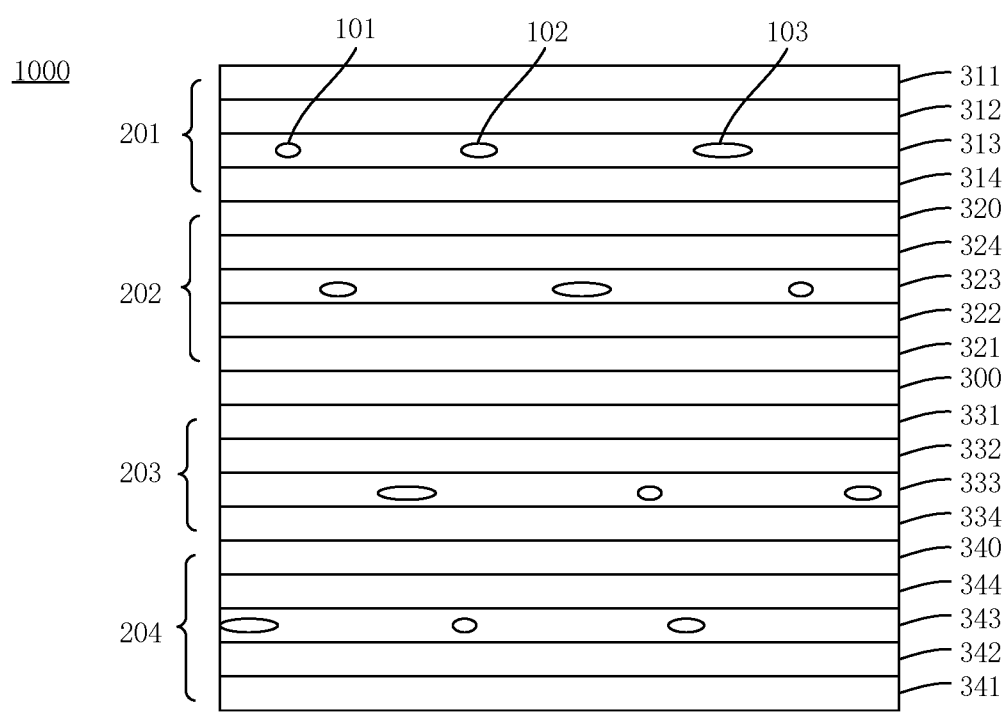
FIG. 1 is a schematic structural view of an organic light-emitting diode display panel provided by an embodiment of the present application.

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments obtained by those skilled in the art without creative efforts shall be within the scope of the present application.

The terms "first", "second", "third", etc. (if present) in the specification and claims of the present application and the above figures are used to distinguish similar objects, and are not necessarily used to describe a specific order or priority. It should be understood that the objects so described are interchangeable where appropriate. Moreover, the terms "comprise" and "has" and any variations thereof are intended to cover a non-exclusive inclusion.

In the specific embodiments, the drawings discussed below and the embodiments used to describe the principles disclosed in the present application are for illustration only, and should not be construed as limiting the scope of the present disclosure. Those skilled in the art will understand that the principles of the present application may be implemented in any suitably arranged system. Exemplary embodiments will be explained in detail, and examples of these embodiments are shown in the drawings. In addition, a terminal according to an exemplary embodiment will be described in detail with reference to the drawings.

The terms used in this specific embodiment are only used to describe a specific embodiment, and are not intended to show the concept of the present application. Unless there are clearly different meanings in the context, expressions used in the singular form include expressions in the plural form. In the description of the present application, it is to be understood that the terms such as "include", "have", and "include" are intended to describe the possibility of one or more other features, numbers, steps, actions, or combinations disclosed in the present invention, and are not intended to exclude the possibility that one or more other features, numbers, steps, acts, or combinations thereof may be added. The same reference numbers in the drawings refer to the same parts.

As shown in FIG. 1, FIG. 1 is a schematic structural view of an organic light-emitting diode (OLED) display panel provided by an embodiment of the present application. An OLED display panel includes a first display panel 201, a second display panel 202, a third display panel 203, and a fourth display panel 204.

An OLED display panel 1000 includes the first display panel 201, the second display panel 202, the third display panel 203, and the fourth display panel 204 all sequentially disposed in a stack arrangement from top to bottom. Each of the first display panel 201, the second display panel 202, the third display panel 203, and the fourth display panel 204 is provided to emit light in a light-emitting direction the same as each other. In addition, each of the first display panel 201, the second display panel 202, the third display panel 203, and the fourth display panel 204 has light transmittance.

Specifically, the fourth display panel 204 includes a fourth thin-film encapsulation layer 341, a reflective cathode layer 342, a fourth OLED layer 343, a fourth array layer 344, and a second light-transmissive substrate 340. OLED layers mentioned in this article are also referred to as organic light-emitting layers, which are embodied below as the OLED layer 343, a third OLED layer 333, a second OLED layer 323, and a first OLED layer 313.

In this embodiment, the fourth thin-film encapsulation layer 341 has an inorganic/organic/inorganic stacked structure. An inorganic encapsulation layer may be made of a material containing an inorganic material, such as silicon nitride, silicon oxide, silicon oxynitride, etc. Inorganic materials are highly dense and can prevent intrusion of moisture, oxygen, etc. An organic encapsulation layer may be made a polymer material containing a desiccant or a polymer material capable of blocking water vapor, etc., such as a polymer resin to flatten a surface of a display substrate and to relieve stress of the inorganic encapsulation layer. Alternatively, the organic encapsulation layer may also include water-absorbing materials such as a desiccant material to absorb water, oxygen, and other substances that invade inside. In addition, the fourth thin-film encapsulation layer 341 may have a thickness between 5 microns (μm) and 15 μm.

The reflective cathode layer 342 is disposed on the fourth thin-film encapsulation layer 341.

In this embodiment, the reflective cathode layer 342 may be made of magnesium-silver alloy and has a thickness between 20 nanometers (nm) and 200 nm. An objective of providing the reflective cathode layer is that because the OLED display panel 1000 emits light in a light-emitting direction from the fourth display panel 204 to the first display panel 201, whereas the fourth display panel 204 emits light in a direction opposite to the light-emitting direction of the OLED display panel 1000, the reflective cathode layer 342 is provided to reflect light in a direction the same as the light-emitting direction of the OLED display panel 1000.

The fourth OLED layer 343 is disposed on the reflective cathode layer 342.

In this embodiment, the fourth OLED layer 343 has a thickness between 50 nm-400 nm. The fourth OLED layer 343 is provided with a plurality of subpixels spaced apart from each other, wherein the subpixels include a plurality of first subpixels 101, a plurality of second subpixels 102, and a plurality of third subpixels 103, and there is no specific limitation on the color of the subpixels.

The fourth array layer 344 is disposed on the fourth OLED layer 343.

In this embodiment, the fourth array layer 344 is further provided with a transparent anode layer. The transparent anode layer is configured to pass light reflected by the reflective cathode layer 342.

The second light-transmissive substrate 340 is disposed on the fourth array layer 344.

In this embodiment, the second light-transmissive substrate 340 is made of materials including silicon nitride and silicon oxynitride as a transparent second light-transmissive substrate. The second light-transmissive substrate 340 may have a thickness between 8 μm and 30 μm.

The third display panel 203 includes a third array layer 334, a third OLED layer 333, a third translucent cathode layer 332, and a third thin-film encapsulation layer 331.

The third array layer 334 is disposed on the second light-transmissive substrate 340.

In this embodiment, the third array layer 334 is further provided with a transparent anode layer. The transparent anode layer is configured to enable penetration of the light reflected by the reflective cathode layer 342.

The third OLED layer 333 is disposed on the third array layer 334.

In this embodiment, the third OLED layer 333 has a thickness between 50 nm-400 nm. The third OLED layer 333 is provided with a plurality of subpixels spaced apart from each other, wherein the subpixels include a plurality of first subpixels 101, a plurality of second subpixels 102, and a plurality of third subpixels 103, and there is no specific limitation on the color of the subpixels.

The third translucent cathode layer 332 is disposed on the third OLED layer 333.

In this embodiment, the third translucent cathode layer 332 may be made of magnesium-silver alloy and has a thickness between 7 nm and 20 nm.

The third thin-film encapsulation layer 331 is disposed on the third translucent cathode layer 332.

In this embodiment, the third thin-film encapsulation layer 331 has an inorganic/organic/inorganic stacked structure. An inorganic encapsulation layer may be made of a material containing an inorganic material, such as silicon nitride, silicon oxide, silicon oxynitride, etc. Inorganic materials are highly dense and can prevent intrusion of moisture, oxygen, etc. An organic encapsulation layer may be made a polymer material containing a desiccant or a polymer material capable of blocking water vapor, etc., such as a polymer resin to flatten a surface of a display substrate and to relieve stress of the inorganic encapsulation layer. Alternatively, the organic encapsulation layer may also include water-absorbing materials such as a desiccant material to absorb water, oxygen, and other substances that invade inside. In addition, the third thin-film encapsulation layer 331 may have a thickness between 5 μm and 15 μm.

The second display panel 202 includes a second thin-film encapsulation layer 321, a second translucent cathode layer 322, a second OLED layer 323, a second array layer 324, and a first light-transmissive substrate 320.

In this embodiment, an optical adhesive layer 300 is disposed between the second display panel 202 and the third display panel 203. The optical adhesive layer 300 has a thickness between 0.5 μm and 5 μm.

In this embodiment, the second thin-film encapsulation layer 321 has an inorganic/organic/inorganic stacked structure. An inorganic encapsulation layer may be made of a material containing an inorganic material, such as silicon nitride, silicon oxide, silicon oxynitride, etc. Inorganic materials are highly dense and can prevent intrusion of moisture, oxygen, etc. An organic encapsulation layer may be made a polymer material containing a desiccant or a polymer material capable of blocking water vapor, etc., such as a polymer resin to flatten a surface of a display substrate and to relieve stress of the inorganic encapsulation layer. Alternatively, the organic encapsulation layer may also include water-absorbing materials such as a desiccant material to absorb water, oxygen, and other substances that invade inside. In addition, the second thin-film encapsulation layer 321 may have a thickness between 5 μm and 15 μm.

The second translucent cathode layer 322 is disposed on the second OLED layer 321.

In this embodiment, the second translucent cathode layer 322 may be made of magnesium-silver alloy and has a thickness between 7 nm and 20 nm.

The second OLED layer 323 is disposed on the second translucent cathode layer 322.

In this embodiment, the second OLED layer 323 has a thickness between 50 nm-400 nm. The second OLED layer 323 is provided with a plurality of subpixels spaced apart from each other, wherein the subpixels include a plurality of first subpixels 101, a plurality of second subpixels 102, and a plurality of third subpixels 103, and there is no specific limitation on the color of the subpixels.

The second array layer 324 is disposed on the second OLED layer 323.

In this embodiment, the second array layer 324 is further provided with a transparent anode layer. The transparent anode layer is configured to enable penetration of the light reflected by the reflective cathode layer 342.

The first light-transmissive substrate 320 is disposed on the second array layer 324.

In this embodiment, the first light-transmissive substrate 320 is made of materials including silicon nitride and silicon oxynitride as a transparent first light-transmissive substrate. The first light-transmissive substrate 320 may have a thickness between 8 μm and 30 μm.

The first display panel 201 includes a first array layer 314, a first OLED layer 313, a first translucent cathode layer 312, and a first thin-film encapsulation layer 311.

The first array layer 314 is disposed on the first light-transmissive substrate 310.

In this embodiment, the first array layer 314 is further provided with a transparent anode layer. The transparent anode layer is configured to enable penetration of the light reflected by the reflective cathode layer 342.

The first OLED layer 313 is disposed on the first array layer 314.

In this embodiment, the first OLED layer 313 has a thickness between 50 nm-400 nm. The first OLED layer 313 is provided with a plurality of subpixels spaced apart from each other, wherein the subpixels include a plurality of first subpixels 101, a plurality of second subpixels 102, and a plurality of third subpixels 103, and there is no specific limitation on the color of the subpixels.

The first translucent cathode layer 312 is disposed on the first OLED layer 313.

In this embodiment, the first translucent cathode layer 312 may be made of magnesium-silver alloy and has a thickness between 7 nm and 20 nm.

The first thin-film encapsulation layer 311 is disposed on the first translucent cathode layer 312.

In this embodiment, the first thin-film encapsulation layer 311 has an inorganic/organic/inorganic stacked structure. An inorganic encapsulation layer may be made of a material containing an inorganic material, such as silicon nitride, silicon oxide, silicon oxynitride, etc. Inorganic materials are highly dense and can prevent intrusion of moisture, oxygen, etc. An organic encapsulation layer may be made a polymer material containing a desiccant or a polymer material capable of blocking water vapor, etc., such as a polymer resin to flatten a surface of a display substrate and to relieve stress of the inorganic encapsulation layer. Alternatively, the organic encapsulation layer may also include water-absorbing materials such as a desiccant material to absorb water, oxygen, and other substances that invade inside. In addition, the first thin-film encapsulation layer 311 may have a thickness between 5 μm and 15 μm.

In this embodiment, orthographic projections of the first subpixels 101, the second subpixels 102, and the third subpixels 103 projected on a horizontal surface are not overlapping one another. In this manner, the first subpixels, the second subpixels, and the third subpixels are prevented from blocking light being emitted due to overlapping structure, so that the OLED display panel 1000 is guaranteed to display normally.

Compared to the prior art, the present application has advantages as follows: by using four display panels sequentially disposed in a stack arrangement from top to bottom, light emitted in a same direction from each of the display panels, and the subpixels of the four display panels not overlapping one another, a screen resolution of the OLED display panel 1000 can increase by three times without increasing pixel density of masks (or not using a fine metal mask, or FMM for short) or density of array layers.

Figure 2:
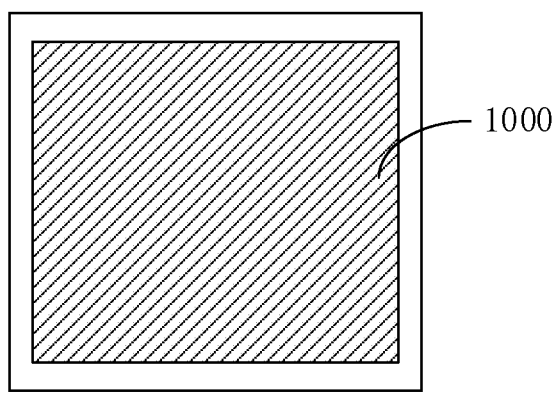
FIG. 2 is a schematic structural view of a display device provided by an embodiment of the present application.

FIG. 2 is a schematic structural view of a display device provided by an embodiment of the present application. The display device includes the OLED display panel 1000 in the aforementioned embodiments. The display device may be any product or component with a display function, such as a liquid crystal television (TV), a liquid crystal display device (such as a flexible display or a high-efficiency display), a mobile phone, a digital photo frame, a tablet computer, or the like.

The OLED display panels provided by the variety of embodiments of the present application are described in detail above. In this article, specific examples are used to explain the principle and implementation of the present application. The descriptions of the above embodiments are only used to help understand the method and the core idea of the present application. Also, according to the idea of this application, those skilled in the art can make changes to the specific embodiments and application scope. Accordingly, the content of this specification should not be understood as a limitation of this application

What is claimed is:

1. An organic light-emitting diode (OLED) display panel, comprising:
   a first display panel, a second display panel, a third display panel, and a fourth display panel all sequentially disposed in a stack arrangement from top to bottom, wherein an optical adhesive layer is disposed between the second display panel and the third display panel;
   wherein each of the first display panel, the second display panel, the third display panel, and the fourth display panel comprises a plurality of subpixels spaced apart from each other, and the plurality of subpixels comprise a plurality of first subpixels, a plurality of second subpixels, and a plurality of third subpixels all spaced apart from each other in sequence;
   wherein each of the first display panel, the second display panel, the third display panel, and the fourth display panel is provided with a light-emitting direction the same as each other, and each of the first display panel, the second display panel, the third display panel, and the fourth display panel has light transmittance,
   wherein the first display panel and the second display panel share a first light-transmissive substrate, the first display panel is disposed on the first light-transmissive substrate, the first light-transmissive substrate is disposed on the second display panel;
   the third display panel and the fourth display panel share a second light-transmissive substrate, the third display panel is disposed on the second light-transmissive substrate, the second light-transmissive substrate is disposed on the fourth display panel;
   the fourth display panel comprises:
   a fourth thin-film encapsulation layer;
   a reflective cathode layer disposed on the fourth thin-film encapsulation layer;
   a fourth OLED layer disposed on the reflective cathode layer; and
   a fourth array layer disposed on the fourth OLED layer;
   the second light-transmissive substrate is disposed on the fourth array layer, and the fourth array layer is provided with an anode layer.

2. The OLED display panel of claim 1, wherein orthographic projections of the subpixels projected on a horizontal surface are not overlapping one another.

3. The OLED display panel of claim 1, wherein the third display panel comprises:
   a third array layer disposed on the second light-transmissive substrate;
   a third OLED layer disposed on the third array layer;
   a third translucent cathode layer disposed on the third OLED layer; and
   a third thin-film encapsulation layer disposed on the third translucent cathode layer.

4. The OLED display panel of claim 3, wherein the anode layer in the fourth array layer is transparent, and the third array layer is provided with a transparent anode layer.

5. The OLED display panel of claim 1, wherein the second display panel comprises:
   a second thin-film encapsulation layer;
   a second translucent cathode layer disposed on the second thin-film encapsulation layer;
   a second OLED layer disposed on the second translucent cathode layer; and
   a second array layer disposed on the second OLED layer;
   wherein the first light-transmissive substrate is disposed on the second array layer.

6. The OLED display panel of claim 5, wherein the first display panel comprises:
   a first array layer disposed on the first light-transmissive substrate;
   a first OLED layer disposed on the first array layer;
   a first translucent cathode layer disposed on the first OLED layer; and
   a first thin-film encapsulation layer disposed on the first translucent cathode layer.

7. The OLED display panel of claim 6, wherein each of the second array layer and the first array layer is provided with a transparent anode layer.

8. An organic light-emitting diode (OLED) display panel, comprising:
- a first display panel, a second display panel, a third display panel, and a fourth display panel all sequentially disposed in a stack arrangement from top to bottom;
- wherein each of the first display panel, the second display panel, the third display panel, and the fourth display panel comprises a plurality of subpixels spaced apart from each other;
- wherein each of the first display panel, the second display panel, the third display panel, and the fourth display panel is provided with a light-emitting direction the same as each other, and each of the first display panel, the second display panel, the third display panel, and the fourth display panel has light transmittance,
- wherein the first display panel and the second display panel share a first light-transmissive substrate, the first display panel is disposed on the first light-transmissive substrate, the first light-transmissive substrate is disposed on the second display panel;
- the third display panel and the fourth display panel share a second light-transmissive substrate, the third display panel is disposed on the second light-transmissive substrate, the second light-transmissive substrate is disposed on the fourth display panel;
- the fourth display panel comprises:
- a fourth thin-film encapsulation layer;
- a reflective cathode layer disposed on the fourth thin-film encapsulation layer;
- a fourth OLED layer disposed on the reflective cathode layer; and
- a fourth array layer disposed on the fourth OLED layer;
- the second light-transmissive substrate is disposed on the fourth array layer, and the fourth array layer is provided with an anode layer.

9. The OLED display panel of claim 8, wherein orthographic projections of the subpixels projected on a horizontal surface are not overlapping one another.

10. The OLED display panel of claim 8, wherein the third display panel comprises:
- a third array layer disposed on the second light-transmissive substrate;
- a third OLED layer disposed on the third array layer;
- a third translucent cathode layer disposed on the third OLED layer; and
- a third thin-film encapsulation layer disposed on the third translucent cathode layer.

11. The OLED display panel of claim 10, wherein the anode layer in the fourth array layer is transparent, and the third array layer is provided with a transparent anode layer.

12. The OLED display panel of claim 8, wherein the second display panel comprises:
- a second thin-film encapsulation layer;
- a second translucent cathode layer disposed on the second thin-film encapsulation layer;
- a second OLED layer disposed on the second translucent cathode layer; and
- a second array layer disposed on the second OLED layer;
- wherein the first light-transmissive substrate is disposed on the second array layer.

13. The OLED display panel of claim 12, wherein the first display panel comprises:
- a first array layer disposed on the first light-transmissive substrate;
- a first OLED layer disposed on the first array layer;
- a first translucent cathode layer disposed on the first OLED layer; and
- a first thin-film encapsulation layer disposed on the first translucent cathode layer.

14. The OLED display panel of claim 13, wherein each of the second array layer and the first array layer is provided with a transparent anode layer.

15. The OLED display panel of claim 8, wherein the plurality of subpixels comprise a plurality of first subpixels, a plurality of second subpixels, and a plurality of third subpixels all spaced apart from each other in sequence.

16. The OLED display panel of claim 8, wherein an optical adhesive layer is disposed between the second display panel and the third display panel.

* * * * *